(12) United States Patent
Ohsono

(10) Patent No.: US 6,320,245 B1
(45) Date of Patent: *Nov. 20, 2001

(54) RADIATION-HARDENED SEMICONDUCTOR DEVICE

(75) Inventor: Katsuhiro Ohsono, Tokyo (JP)

(73) Assignee: NEC Corporation (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/314,581

(22) Filed: May 18, 1999

(30) Foreign Application Priority Data

May 19, 1998 (JP) .................. 10-136909

(51) Int. Cl.$^7$ ................................. H01L 23/58
(52) U.S. Cl. ................ 257/648; 257/647; 257/649; 257/659; 257/660
(58) Field of Search .................. 257/648, 647, 257/649, 659, 660

(56) References Cited

U.S. PATENT DOCUMENTS

| | | | |
|---|---|---|---|
| 4,506,435 | * 3/1985 | Pliskin et al. | 29/576 |
| 5,038,193 | * 8/1991 | Kamigaki et al. | 357/49 |
| 5,081,517 | * 1/1992 | Contiero et al. | 357/43 |
| 5,350,942 | * 9/1994 | Jerome et al. | 257/648 |
| 5,541,435 | * 7/1996 | Beasom | 257/409 |

FOREIGN PATENT DOCUMENTS

| | | | | |
|---|---|---|---|---|
| 405075043 | * 3/1993 | (JP) | | 257/648 |
| 2304949 | 12/1990 | (JP) | | H01L/21/76 |
| 6140502 | 5/1994 | (JP) | | H01L/21/76 |
| 8-227936 | 9/1996 | (JP) | | H01L/21/76 |
| 982793 | 3/1997 | (JP) | | H01L/21/76 |
| 625654 | 1/1987 | (JP) | | H01L/27/08 |
| 61164265 | 7/1986 | (JP) | | H01L/29/78 |
| 62-262462 | 11/1987 | (JP) | | H01L/29/78 |

OTHER PUBLICATIONS

"Radiation–Hardened CMOS 177k Gate Array Having Libraries Compatible with Commercial Ones" Ohsono et al IEEE Nuclear and Space Radiation Effects Conference; Jul. 20, 1994; p. 37–40.

* cited by examiner

Primary Examiner—Eddie Lee
Assistant Examiner—Edgardo Ortiz
(74) Attorney, Agent, or Firm—Hayes, Soloway, Hennessey, Grossman & Hage P.C.

(57) ABSTRACT

Boron ions are implanted in the boundary of the field oxide film and P type well, and a first high energy boron implantation P layer is formed. Further boron ions are implanted near the center of the field oxide film in the thickness direction, and a second high energy boron implantation P layer is formed. The first and second high energy boron implantation P layers are spaced away from the N type diffusion layer.

5 Claims, 6 Drawing Sheets

MASK PATTERN OF OXIDE FILM

MASK PATTERN OF P TYPE WELL
(INVERSION OF N WELL PATTERN)

MASK PATTERN OF FIRST HIGH ENERGY
BORON IMPLANTATION P LAYER

MASK PATTERN OF SECOND HIGH ENERGY
BORON IMPLANTATION P LAYER

N CHANNEL THRESHOLD VOLTAGE CONTROL
BORON IMPLANTATION PATTERN

PATTERN PROCESSED BY THINNING A PATTERN
OBTAINED BY AND OF FIG.4 AND FIG.8

MASK PATTERN OF
N CHANNEL SD LAYER

PATTERN OBTAINED BY AND
OF FIG.4 AND FIG.8

PATTERN PROCESSED BY THINNING A PATTERN
OBTAINED BY OR OF FIG.11 AND FIG.5

RADIATION-HARDENED SEMICONDUCTOR DEVICE

BACKGROUND OF THE INVENTION

1. Field of the Invention

The present invention relates to a semiconductor device and a method for manufacturing the same, and more particularly to a radiation-hardened semiconductor device and a method for manufacturing the same.

2. Description of the Related Art

When using semiconductor devices containing MOS transistors as components for space appliances, static consumption current increases due to effects of space rays (such as gamma-rays). When a semiconductor device is exposed to gamma-rays, hole-electron pairs are generated in the field oxide film which separates between elements, and holes having the smaller mobility of them are captured in the interface between the silicon substrate and silicon oxide film, and a fixed positive charge is formed, and the threshold voltage of parasitic N channel MOS transistor is lowered, and the conductive type of the silicon substrate surface contacting with the field oxide film may be inverted to increase the leakage current.

Conventionally, to prevent such increase of leakage current, a P type high concentration impurity region called a guard band is formed around the N channel MOS transistor to prevent inversion of conductive type of the surface of P type substrate (or P type well).

For example, in the case of gate array, as shown in the publication "A Radiation-Hardened CMOS 177 k Gate Array Having Libraries Compatible With Commercial Ones," K. Ohsono et al., 1994 IEEE Radiation Effects Data Workshop, pp. 37–40, Jul. 20, 1994 (particularly FIG. 1), against leakage within element N (leakage between the source and drain), a high concentration guard boron P layer is formed in the boundary of the source and field oxide film, and in the boundary of the drain and field oxide film, and against leakage between elements, a high energy boron P layer or high concentration boron P layer is formed around the N channel MOS transistor, and the inversion of conductive type is prevented.

Incidentally, the high concentration guard boron P layer for preventing leakage within element N is disclosed in Japanese Laid-open Publication No. 61-164265, the high energy boron P layer for preventing leakage between elements is disclosed in Japanese Laid-open Publication No. 2-304949 or Japanese Laid-open Publication No. 6-140502, and the high concentration boron P layer for preventing leakage between elements is disclosed in Japanese Laid-open Publication No. 62-5654. Moreover, Japanese Laid-open Publication No. 9-82793 discloses a forming method of a channel stopper layer contacting with the lower surface of the field oxide film Conventional semiconductors are described below, and first a semiconductor device for general use which is not radiation-hardened is explained, and then the structure and manufacturing method of a radiation-hardened semiconductor device are described.

First, as a conventional semiconductor for general use, gate array is described by referring to FIGS. 1A and 1B. FIG. 1A is a plan view of this gate array, and FIG. 1B is a sectional view along line K–K' in FIG. 1A.

As shown in FIGS. 1A and 1B, this gate array has a basic cell 34. In an actual gate array, this basic cell 34 is repeatedly developed symmetrically on four sides (broken line in FIG. 1A), and the gate array is composed.

In a PMOS region 31, three P type diffusion layers 15, gate electrodes 18 disposed between the P type diffusion layers, and N type well contacts 16 are formed in the N type well 12 (surface side) on the P type substrate 11, and a pair of P channel MOS transistors are formed. In each one of the NMOS region N 32 and NMOS region N 33 for transfer gate, three N type diffusion layers 14, gate electrodes 18, and P type well contacts 17 are formed in the P type well 13, so that a pair of N channel MOS transistors are formed.

Further, the PMOS region 31 and NMOS region 32, the NMOS region 32 and NMOS region 33 for transfer gate, and the NMOS regions 33 for transfer gate mutually are respectively separated from each other by means of the field oxide film 19. A guard ring boron layer 25 is formed immediately beneath the field oxide film 19 formed at the P type well 13 side.

A manufacturing method of this gate array is described below.

First, the P type substrate 11 is prepared, and N type wells 12 and P type wells 13 are formed selectively. In the N type well region 12, the PMOS region 31 is finally formed, and in the P type well region 13, the NMOS region 32 and NMOS region 33 for transfer gate are finally formed.

Next, to form the guard ring boron layer 25, except for the area for forming N type diffusion layer 14 and P type well contact 17 of the P type well region 13, boron ions are implanted (100 keV, $1 \times 10^{13}$ cm$^{-2}$). Then, by LOCOS (local oxidation of silicon) method, the field oxide film 19 is formed selectively in other regions than the area for forming N type diffusion layer 14, P type diffusion layer 15, N type well contact 16, and P type well contact 17 in later processes. As a result, the guard ring boron layer 25 is formed beneath the field oxide film 19 at the P type well 13 side.

Afterwards, boron ions are implanted in order to control the threshold voltage of N channel MOS transistor and control the threshold voltage of P channel MOS transistor. Then, a gate electrode 18 is formed.

To form the N type diffusion layer 14 and N type well contact 16, arsenic (or phosphorus) ions are implanted. Similarly, to form the P type diffusion layer 15 and P type well contact 17, boron (or boron fluoride) ions are implanted.

Consequently, by repeated steps of interlayer film growth such as BPSG, formation of contact hole and via hole for electric connection, and formation of aluminum wiring and others, a semiconductor device is completed.

Thus, the gate array for general use is constructed and manufactured.

Next, a radiation-hardened semiconductor device and its manufacturing method are described below.

As shown in FIGS. 2A and 2B, the gate array which is radiation-hardened comprises, in addition to the constitution in FIG. 1, a high concentration guard boron P layer 23 contacting with the field oxide film 19 and N type diffusion layer 14, in order to prevent leakage between source and drain (leakage between the middle diffusion layer and diffusion layers positioned at its both sides, of the three N type diffusion layers 14 in each region) of the N channel MOS transistor formed individually in the NMOS region 32 and NMOS region 33 for transfer gate.

Next, a guard band P layer 24 and a high energy boron implantation P layer 21 are formed in order to prevent leakage between the N type well 12 and the source (or drain) of N channel MOS transistor of the NMOS region 32, to prevent leakage between the source (or drain) of N channel MOS transistor of the NMOS region 32 and the drain (or source) of N channel MOS transistor of the NMOS region 33 for transfer gate, and to prevent leakage between the drain (or source) of N channel MOS transistor of the NMOS region 33 for transfer gate and the source (or drain) of N channel MOS transistor of the adjacent basic cell (at the right side in the drawing, not shown).

Thereafter, a high energy boron implantation P layer 21 is formed between the source (or drain) of N channel MOS transistor for in one of the two NMOS regions 33 for transfer gate, and the drain (or source) of the N channel MOS transistor formed in the other, in order to prevent leakage between them.

A manufacturing method of this semiconductor device is described below.

First, the P type substrate 11 is prepared, and N type wells 12 and P type wells 13 are formed selectively. In the N type well region 12, the PMOS region 31 is finally formed, and in the P type well region 13, the NMOS region 32 and NMOS region 33 for transfer gate are finally formed.

Next, to form the guard ring boron layer 25, except for the area for forming N type diffusion layer 14 and P type well contact 17 of the P type well region 13, boron ions are implanted (100 keV, $1\times10^{13}$ cm$^{-2}$). Then, by LOCOS (local oxidation of silicon) method, the field oxide film 19 is formed selectively in other regions than the area for forming N type diffusion layer 14, P type diffusion layer 15, N type well contact 16, and P type well contact 17 in later processes. As a result, the guard ring boron layer 25 is formed beneath the field oxide film 19 at the P type well 13 side. So far, the process is same as in the manufacturing method of the semiconductor device for general use.

Then a high energy boron implantation P layer 21, a high concentration guard boron P layer 23, and a guard band P layer 24 are formed, by using different masks, by implanting boron ions selectively. Further, boron ions are implanted in order to control the threshold voltage of N channel MOS transistor and control the threshold voltage of P channel MOS transistor. At this time, the sequence of boron ion implantation is not particularly specified.

Then, a gate electrode 18 is formed. To form the N type diffusion layer 14 and N type well contact 16, arsenic (or phosphorus) ions are implanted. Similarly, to form the P type diffusion layer 15 and P type well contact 17, boron (or boron fluoride) ions are implanted.

Finally, by repeated steps of interlayer film growth such as BPSG, formation of contact hole and via hole for electric connection, and formation of aluminum wiring and others, a semiconductor device is completed.

Thus, the gate array which is radiation-hardened is constructed and manufactured.

However, these conventional semiconductor devices have several problems. As a first problem, in the radiation-hardened semiconductor device, as compared with the product for general use, it requires more manufacturing steps, and a longer time in manufacture, and is hence raised in cost.

The reason is that, in order to enhance the resistance to radiation, it requires steps for forming high energy boron implantation P layer, high concentration guard boron P layer, and guard band P layer, in addition to the process of forming the product for general use.

As a second problem, of the three P layers added for enhancing the resistance to radiation, as for the two P layers of high concentration guard boron P layer and guard band P layer, mask data cannot be obtained easily from the layout of the product for general use. It means that the design is difficult for fortifying the resistance to radiation in the LSI for exclusive use such as CPU.

The reason is that the forming positions (shapes) of the high concentration guard boron P layer and guard band P layer do not coincide with other film such as field oxide layer.

As a third problem, in the intersecting portion of the guard band P layer and gate electrode, the parasitic capacity between the gate and substrate increases.

The reason is that the capacity between the gate - electrode and substrate is large in the intersecting portion of the guard band P layer and gate electrode because the field oxide film is thin.

SUMMARY OF THE INVENTION

It is an object of the present invention to provide a radiation-hardened semiconductor device, and its manufacturing method, not requiring any particular layout for fortifying the resistance to radiation, easy in application of mask layout pattern for general use, and capable of decreasing the number of steps.

The semiconductor device having an N channel MOS transistor according to the present invention comprises a first P type region formed by implanting boron by a first high energy in the boundary of P type substrate or P type well forming the N channel MOS transistor and a field oxide film formed at the surface side of the P type substrate or P type well, and a second P type region formed by implanting boron by a second high energy, lower than the first high energy, near the center in the thickness direction of the field oxide film, in which the field oxide film, the first P type region and the second P type region are all separate from the N type diffusion layer composing the source and drain of the N channel MOS transistor.

The manufacturing method of semiconductor device having an N channel MOS transistor according to the present invention comprises forming a first P type region by implanting boron by a first high energy, before forming a gate electrode of the N channel MOS transistor, after forming a field oxide film for separating elements, and forming a second P type region by implanting boron at a second high energy lower than the first high energy.

In each N channel MOS transistor formed in the NMOS region and NMOS region for transfer gate, leakage between source and drain is prevented by first high energy boron implantation P layer and second high energy boron implantation P layer. These first and second high energy boron implantation P layers are disposed at a specified distance apart from the source and drain of N type diffusion layers.

Similarly, leakage between the N type well and source (or drain) of the NMOS region is prevented by the first high energy boron implantation P layer and second high energy boron implantation P layer. Moreover, leakage between the source (or drain) of N channel MOS transistor of the NMOS region and the drain (or source) of N channel MOS transistor of the NMOS region for transfer gate is prevented by the first high energy boron implantation P layer and second high energy boron implantation P layer. Also, leakage between the source (or drain) of N channel MOS transistor of the NMOS region for transfer gate and the drain (or source) of N channel MOS transistor formed in the NMOS region for transfer gate of the adjacent cell is prevented by the first high energy boron implantation P layer and second high energy boron implantation P layer.

Further, leakage between the source (or drain) of the N channel MOS transistor formed in one of the two NMOS regions for transfer gate and the drain (or source) of the N channel MOS transistor formed in the other is prevented by the first high energy boron implantation P layer and second high energy boron implantation P layer.

BRIEF DESCRIPTION OF THE DRAWINGS

FIGS. 1A and 1B are diagrams showing a conventional semiconductor device for general use, in which FIG. 1A is a plan view and FIG. 1B is a sectional view along line K–K' in FIG. 1A; and FIGS. 2A and 2B are diagrams showing a conventional radiation-hardened semiconductor device, in which FIG. 2A is a plan view and FIG. 2B is a sectional view along line K–K' in FIG. 2A.

FIGS. 3A to 3C are diagrams showing a first embodiment of the invention, in which FIG. 3A is a plan view, FIG. 3B is a sectional view along line K–K' in FIG. 3A, and FIG. 3C is a magnified view of part D in FIG. 3B;

DESCRIPTION OF THE PREFERRED EMBODIMENTS

Figure 1A:
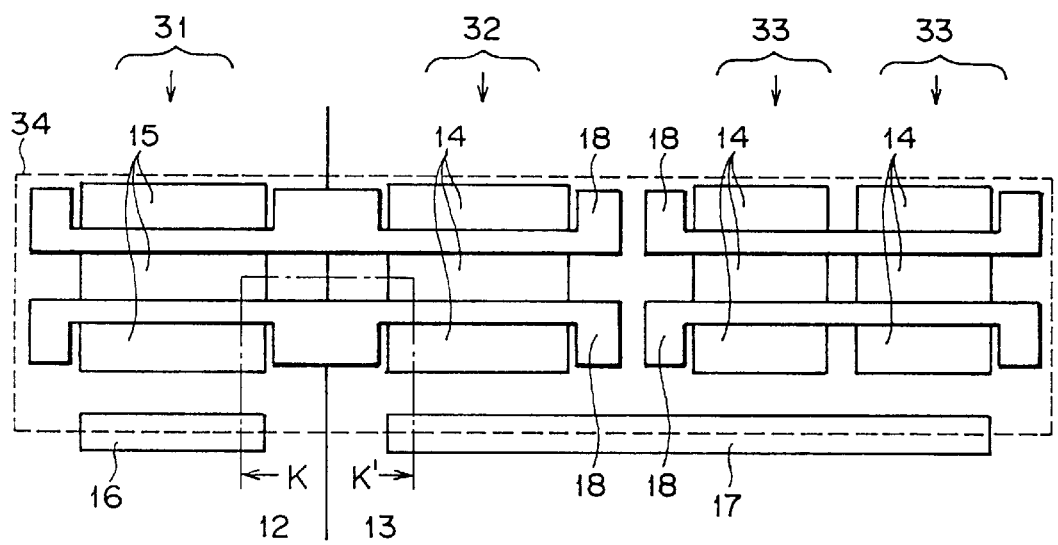
Figure 1B:
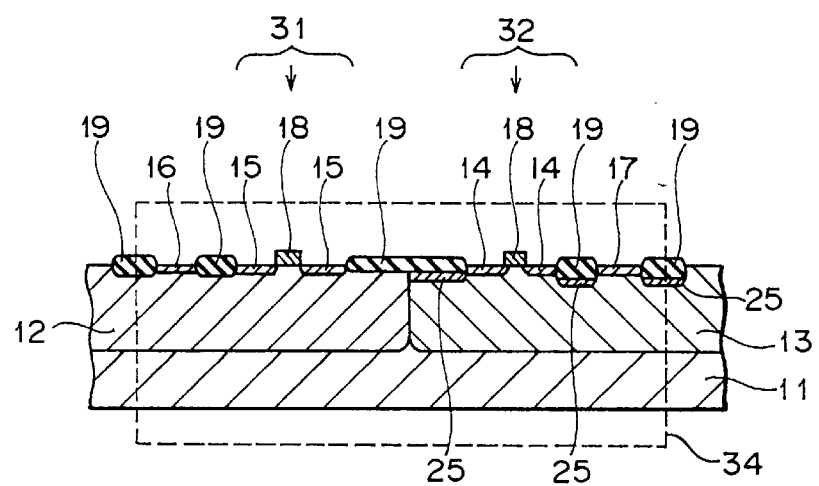
Figure 2A:
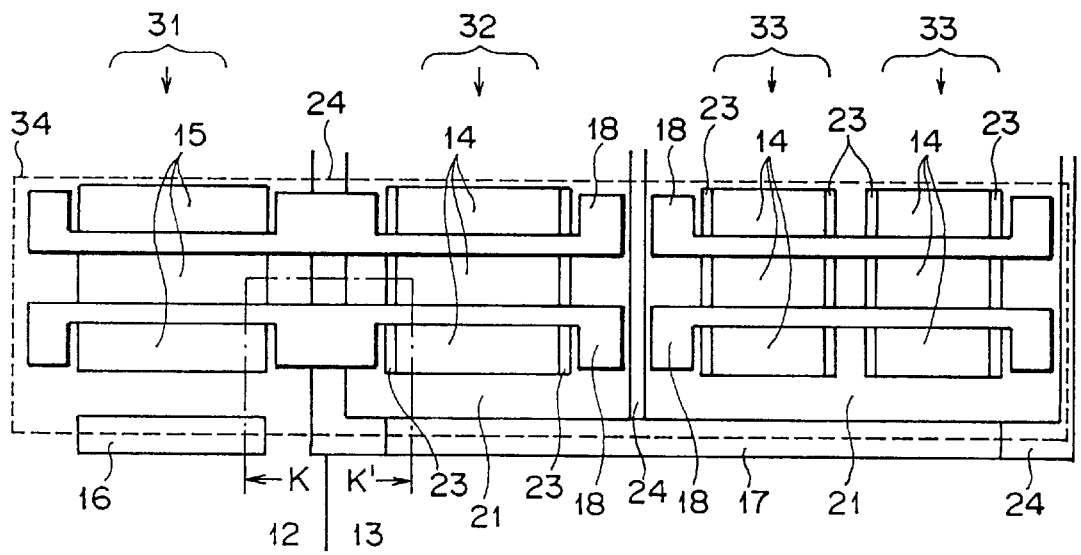
Figure 2B:
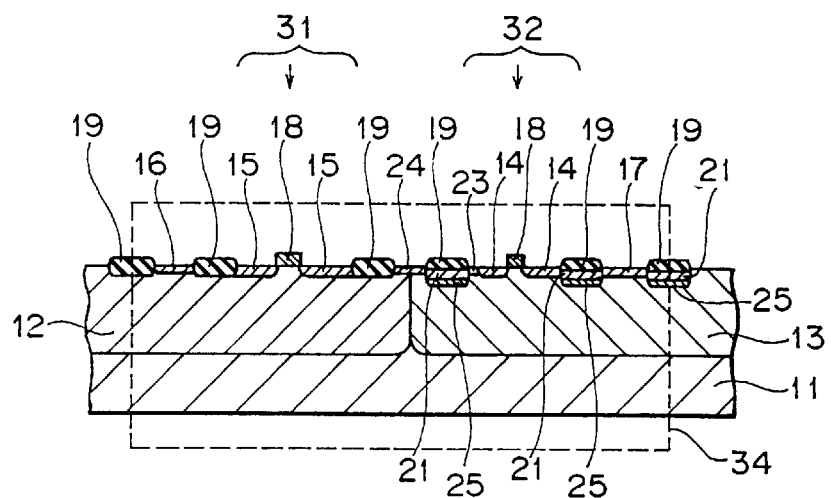

Referring now to the drawings, preferred embodiments of the invention are described in detail below.

Figure 3A:
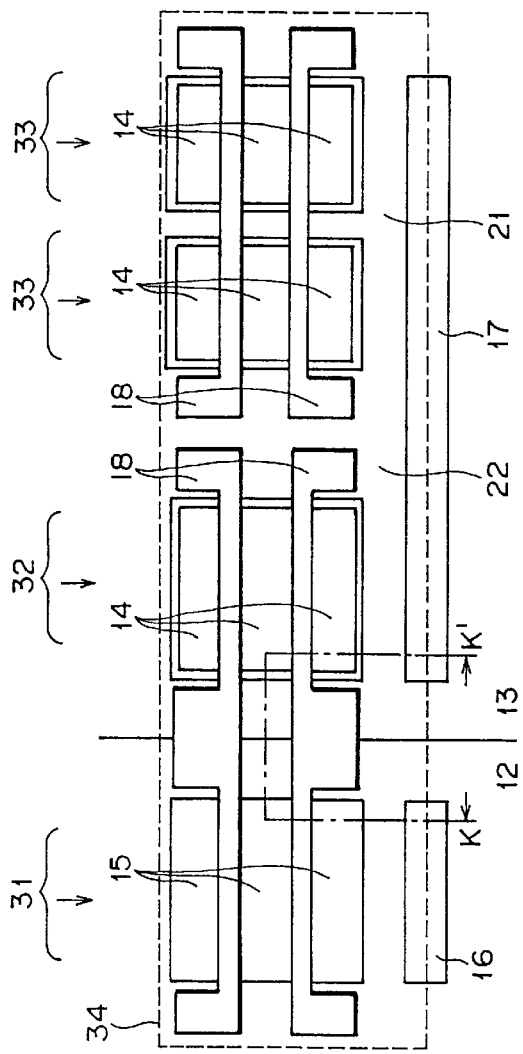
Figure 3C:
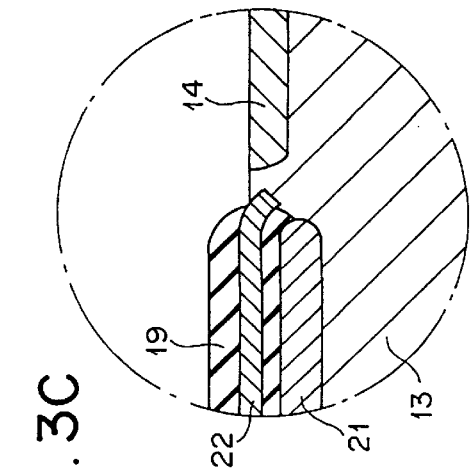
Figure 3B:
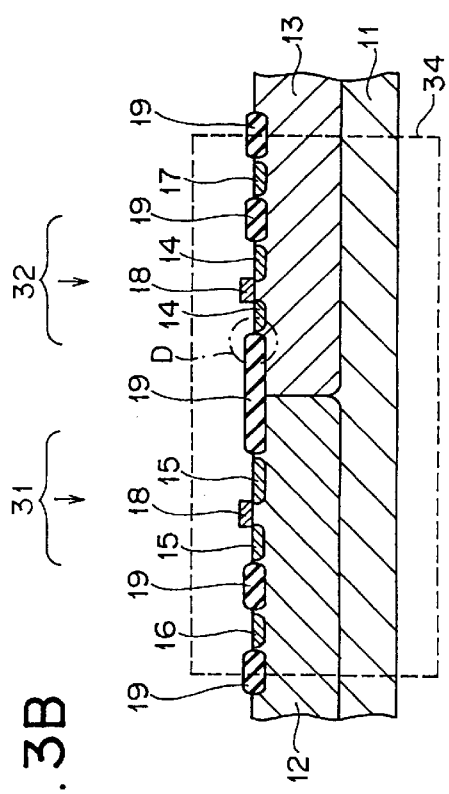

FIGS. 3A to 3C show an embodiment of a semiconductor device according to the invention. FIG. 3A is a plan view of the semiconductor device of the embodiment, FIG. 3B is its sectional view along line K–K', and FIG. 3C is a magnified view of part D in FIG. 3B.

The semiconductor device in FIGS. 3A to 3C is a gate array, and its basic cell 34 incorporates a PMOS region 31, an NMOS region 32, and two NMOS regions 33 for transfer gate. A pair of P channel MOS transistors are formed in the PMOS region 31, a pair of N channel MOS transistors in the NMOS region 32, and a pair of N channel MOS transistors in each one of the two NMOS regions 33 for transfer gate. The actual gate array is composed by repetitively developing symmetrically on four sides of the basic cell (indicated by broken line in FIG. 3A).

The P channel MOS transistor of the PMOS region 31 is formed by forming P type diffusion layer 15, gate electrode 18 and N type well contact 16 in the N type well 12. The P channel MOS transistor of the NMOS region 32 and two NMOS regions 33 for transfer gate is formed by forming N type diffusion layer 14, gate electrode 18 and P type well contact 17 in the P type well 13.

Further, the PMOS region 31 and NMOS region 32, the NMOS region 32 and one NMOS region 33 for transfer gate, and the two NMOS regions 33 for transfer gate are respectively separated from each other by means of the field oxide film 19 (for example, 450 nm in thickness).

At the interface of field oxide film 19 and P type well 13, a first high energy boron implantation P layer 21 is provided (for example, ion implantation energy: 150 keV, dose: $1 \times 10^{14}$ cm$^{-2}$). In the P side well, near the center of the field oxide film (in the thickness direction), a second high energy boron implantation P layer 22 is provided (for example, ion implantation energy: 80 keV, dose: $2 \times 10^{13}$ cm$^{-2}$). The size of this second high energy boron implantation P layer (the area in the plan view) is the same as or larger than the size of the forming region of the first high energy boron implantation P layer 21. The first high energy boron implantation P layer 21 and second high energy boron implantation P layer 22 are spaced away from the N type diffusion layer 14 (0.5 to 1.5 μm, for example, about 0.8 μm) so as not to contact with the N diffusion layer 14 as the source and drain of each N channel MOS transistor of the NMOS region 32 and two NMOS regions 33 for transfer gate. The field oxide film 19 is also spaced away from the N type diffusion layer 14 (0.5 to 2.5 μm) so as not to contact with the N type diffusion layer 14. Such relation is shown in FIG. 3C.

Meanwhile, the first and second high energy boron implantation P layers may be also formed beneath the P type well contact 17 for applying a substrate potential to the N channel MOS transistor.

The reason why the first high energy boron implantation P layer 21 and second high energy boron implantation P layer 22 are spaced away from the N type diffusion layer 14 is as follows. That is, the first high energy boron implantation P layer 21 and second high energy boron implantation P layer 22 are stronger in the effect of enhancing the resistance to radiation of the semiconductor device when the boron concentration is higher. However, if the first high energy boron implantation P layer 21 or second high energy boron implantation P layer 22 contacts with the N type diffusion layer 14, the junction dielectric strength between the N type diffusion layer 14 and P type well 13 is lowered, and the boron concentration of the first high energy boron implantation P layer 21 or second high energy boron implantation P layer 22 cannot be heightened sufficiently. Therefore, these high energy boron implantation P layers 21, 22 must be distant from the N type diffusion layer 14.

The first high energy boron implantation P layer 21 is formed at the interface of the field oxide film 19 and P type well 13, and hence prevents mainly leakage between elements. That is, the first high energy boron implantation P layer 21 suppresses the leak between the N type well 12 and the source (or drain) of N channel MOS transistor of the NMOS region 32, between the source (or drain) of N channel MOS transistor of the NMOS region 32 and the drain (or source) of N channel MOS transistor of the adjacent NMOS region 33 for transfer gate, between the drain (or source) of N channel MOS transistor of the one NMOS region 33 for transfer gate and the source (or drain) of N channel MOS transistor of the other NMOS region 33 for transfer gate, and between the drain (or source) of N channel MOS transistor of the NMOS region 33 for transfer gate and the source (or drain) of N channel MOS transistor of the NMOS region 33 for transfer gate of the adjacent basic cell (not shown).

The second high energy boron implantation P layer 22 is formed near the center of the field oxide film 19 in the thickness direction (depth: about 0.23 µm), and hence mainly suppress leakage within the element of each N channel MOS transistor, that is, leakage between source and drain of N channel MOS transistor.

The reason why the size of the first high energy boron implantation P layer 21 is smaller than the size of the second high energy boron implantation P layer (spacing 0 to 0.5 µm, for example, about 0.2 pm) is that, as mentioned above, since leakage current to be suppressed is different, it is preferred to form the first high energy boron implantation P layer 21 in the bottom of the field oxide film 19, and form the second high energy boron implantation P layer 22 in the peripheral area of the field oxide film 19.

Beneath the P type well contact 17, the first high energy boron implantation P layer 21 and second high energy boron implantation P layer 22 are not always required. This is because the presence or absence of these layers has nothing to do with the electric characteristic of the P type well contact 17.

In this construction, in each N channel MOS transistor formed in the NMOS region 32 and NMOS regions 33 for transfer gate, leakage between source and drain is prevented by the first high energy boron implantation P layer 21 and second high energy boron implantation P layer 22.

Similarly, leakage between the N type well 12 and source (or drain) of the NMOS region 32 is also prevented by the first high energy boron implantation P layer 21 and second high energy boron implantation P layer 22. The leakage between the source (or drain) of N channel MOS transistor of the NMOS region 32 and the drain (or source) of N channel MOS transistor of the NMOS region 33 for transfer gate is also prevented by the first high energy boron implantation P layer 21 and second high energy boron implantation P layer 22. Further, leakage between the source (or drain) of N channel MOS transistor of the NMOS region 33 for transfer gate and the drain (or source) of N channel MOS transistor formed in the NMOS region for transfer gate (not shown) of the adjacent cell is prevented by the first high energy boron implantation P layer 21 and second high energy boron implantation P layer 22.

Leakage between the source (or drain) of N channel MOS transistor formed in one of the two NMOS regions 33 for transfer and the drain (or source) of N channel MOS transistor formed in the other is also prevented by the first high energy boron implantation P layer 21 and second high energy boron implantation P layer 22.

Thus, in the semiconductor device according to the embodiment, by two P layers of the first high energy boron implantation P layer 21 and second high energy boron implantation P layer 22, the same effects as in three layers of high energy boron implantation P layer 21, high concentration guard boron P layer 23, and guard band P layer 24 in the prior art are obtained.

More specifically, leakage between the source and drain of each N channel transistor formed in the NMOS region 32 and NMOS regions for transfer gate is known to be caused by the parasitic transistor existing in the continuous portion from the field oxide film to the gate oxide film (the thickness increasing area). To decrease such leakage by parasitic MOS transistor, its threshold voltage should be raised. It is realized by raising the threshold voltage of the parasitic MOS transistor, increasing the gate oxide film thickness, or raising the substrate impurity concentration. Herein, increase of gate oxide film thickness gives rise to increase in the number of hole-electron pairs generated when irradiated with gamma-rays. Therefore, it is better to increase the substrate impurity concentration. The substrate impurity concentration can be raised by disposing P layer.

Conventionally, to prevent leakage due to parasitic MOS transistor, the high concentration guard boron P layer 23 was used, but in this embodiment, it is prevented by the second high energy boron implantation P layer 22. Since this second high energy boron implantation P layer 22 is remote from the N type diffusion layer 14, its concentration can be heightened, and a sufficient leakage decreasing effect is obtained.

Further, leaking between the N type well 12 and the source (or drain) of N channel MOS transistor formed in the NMOS region 32, and leakage between the source (or drain) of N channel MOS transistor formed in the NMOS region 33 for transfer gate and the drain (or source) of N channel MOS transistor formed in the NMOS region for transfer gate of the adjacent cell were conventionally prevented by the guard band P layer 24, but actually it was not formed in most cases due to restrictions of dimensions. That is, the guard band P layer 24 is not absolutely necessary, and a sufficient leakage preventive effect is obtained by the first high energy boron implantation P layer 21.

A manufacturing method of the semiconductor device of the embodiment is described below.

First of all, a P type substrate 11 (for example, a silicon substrate with an impurity concentration of $1 \times 10^{15}$ cm$^{-2}$ is prepared, and N type well 12 and P type well 13 are selectively formed. The N type well 12 is used as PMOS region 31, and the P type well 13 is used as NMOS region 32 and channel NMOS region 33 for transfer gate, and P channel MOS transistor is finally formed in the N type well 12, and N channel MOS transistor in the P type well 13.

By LOCOS method, consequently, a field oxide film 19 (for example, 450 nm in thickness) is selectively formed in other regions than the area for forming N type diffusion layer 14, P type diffusion layer 15, N type well contact 16, and P type well contact 17 in later steps (to be precise, at a distance of about 1 µm from these regions).

Then, by using different masks (described later), a first high energy boron implantation P layer 21 (ion implantation energy: 120 to 180 keV, dose; $3 \times 10^{13}$ to $3 \times 10^{14}$ cm$^{-2}$), and a second high energy boron implantation P layer 22 (ion implantation energy: 60 to 100 keV, dose: $1 \times 10^{13}$ to $1 \times 10^{14}$ cm$^{-2}$) are formed by implanting boron ions selectively. Boron ions are further implanted for controlling the threshold voltage of the N channel MOS transistor and controlling the threshold voltage of the P channel MOS transistor. The boron ion implantation sequence is not particularly specified (as far as after forming the field oxide film and before forming the gate electrode).

Later, a gate electrode (gate polycide) 18 is formed. D For forming N type diffusion layer 14 and N type well contact 16, arsenic (or phosphorus) ions are implanted. Similarly, for forming P type diffusion layer 15 and P type well contact 17, boron (or boron fluoride) ions are implanted.

Finally, by repeated steps of interlayer film growth such as BPSG, formation of contact hole and via hole for electric connection, and formation of aluminum wiring and others, a semiconductor device is completed.

Next is described the manufacturing method of mask (reticle) used in manufacture of first high energy implantation P layer 21 and second high energy implantation P layer 22.

Figure 4:
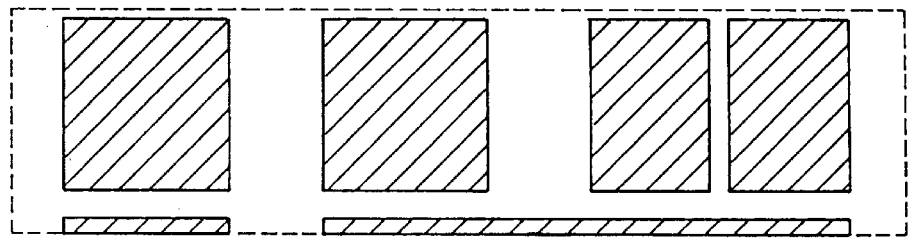
FIG. 4 is a diagram showing a mask pattern for forming a field oxide film.
Figure 5:
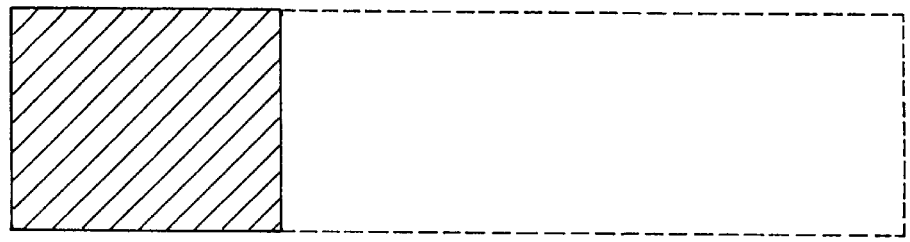
FIG. 5 is a diagram showing a mask pattern for forming a P type well.

FIG. 4 shows a field oxide film pattern. FIG. 5 shows a P well pattern. These patterns correspond to the basic cell 34, and by folding back along the broken line, a mask pattern of gate array is formed. The hatching corresponds to the metal pattern for shielding the light for sensitizing the photo resist.

The mask pattern for forming the first high energy boron implantation P layer 21 can be obtained from the pattern shown in FIG. 4 and FIG. 5. That is, it is obtained by transforming the pattern shown in FIG. 4 and FIG. 5 into digital data, and processing by digital operation.

Figure 6:
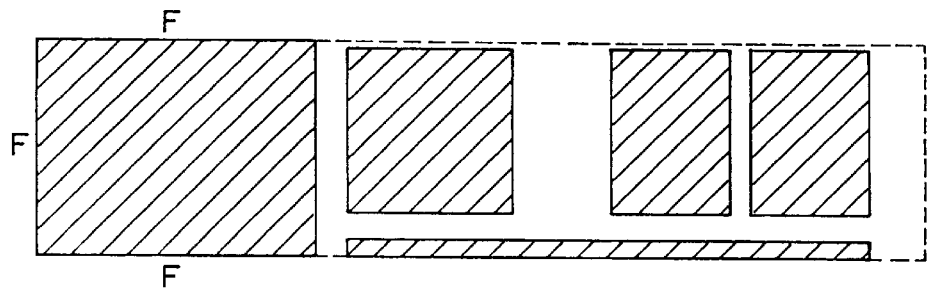
FIG. 6 is a diagram showing a mask pattern for forming a first high energy boron implantation P layer.

More specifically, each pattern is divided into a matrix, and when a divided tiny region corresponds to the hatching portion, the logic value 1 is given, and when corresponding to non-hatching portion, the logic value 0 is given to transform into digital data, and the two-dimensional OR of the field oxide film mask pattern data and P well mask pattern data is obtained. The mask pattern (mask data) obtained as the result is as shown in FIG. 6. This is the mask pattern for forming the first high energy boron implantation P layer.

Figure 7:
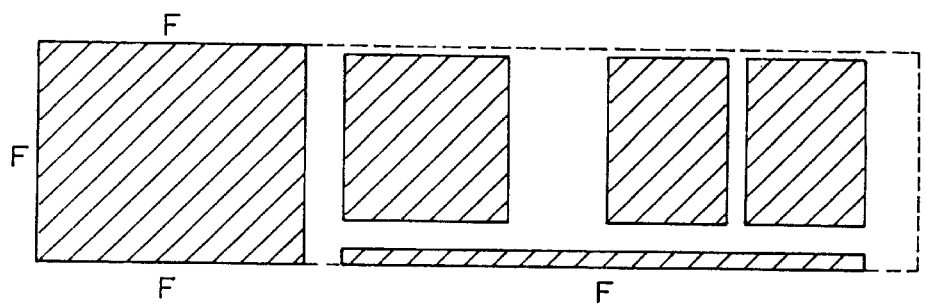
FIG. 7 is a diagram showing a mask pattern for forming a second high energy boron implantation P layer.

Consequently, the mask pattern in FIG. 6 is processed by thinning two-dimensionally (the edge of the hatching is drawn back toward the center, for example, 0.5 to 1.5 μm). Herein, the portion contacting with the edge of the basic cell 34 (indicated by F) is not subject to thinning in relation to the adjacent cell, and is hence not deformed. As a result, the mask pattern as shown in FIG. 7 is obtained. This is the mask pattern for forming the second high energy boron implantation P layer.

Another manufacturing method of mask pattern used in manufacture of the first high energy implantation P layer 21 and second high energy implantation P layer 22 is described below.

This method is a method of obtaining the mask pattern for use in manufacture of the first high energy implantation P layer 21 and second high energy implantation P layer 22, from the field oxide film pattern and the mask pattern for implanting threshold voltage control boron of the N channel MOS transistor.

Herein, for understanding of the mask pattern for implanting threshold voltage control boron of the N channel MOS transistor, a method of preparing a mask pattern for fabricating N channel SD (source/drain) layer is described.

Figure 8:
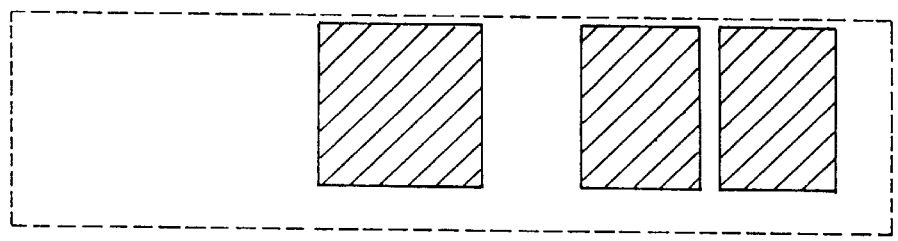
FIG. 8 is a diagram showing a boron implantation pattern for controlling the threshold voltage of N channel MOS transistor.
Figure 9:
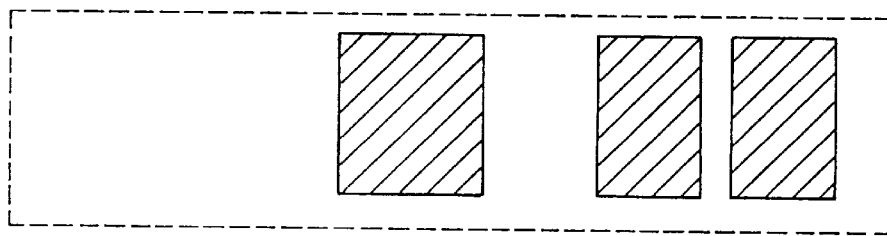
FIG. 9 is a diagram showing a pattern obtained by thinning a pattern obtained by AND of patterns in FIG. 4 and FIG. 8.
Figure 10:
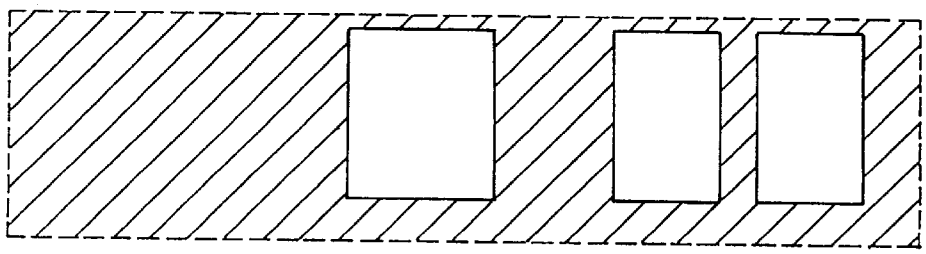
FIG. 10 is a diagram showing a mask pattern for forming N channel SD layer.

The N channel SD layer pattern is obtained from the field oxide film pattern shown in FIG. 4 and the mask pattern for selecting the portion for implanting the threshold voltage control boron of the N channel MOS transistor shown in FIG. 8. That is, the AND of the mask data expressing the mask pattern in FIG. 4 and the mask data expressing the mask pattern in FIG. 8 is determined, and the obtained mask pattern is processed by thinning two-dimensionally (0.5 to 2.5 pm), so that the mask pattern shown in FIG. 9 is obtained. By inverting this mask pattern, the N channel SD layer selection mask pattern shown in FIG. 10 is obtained.

Thus, the mask pattern for implanting the threshold voltage control boron of the N channel MOS transistor is a mask pattern necessary for obtaining the N channel SD layer mask pattern, and is not a mask pattern particularly prepared for manufacturing the first high energy implantation P layer 21 and second high energy implantation P layer 22.

The description goes back to the manufacturing method of the mask pattern used in manufacture of the first high energy implantation P layer 21 and second high energy implantation P layer 22.

Figure 11:
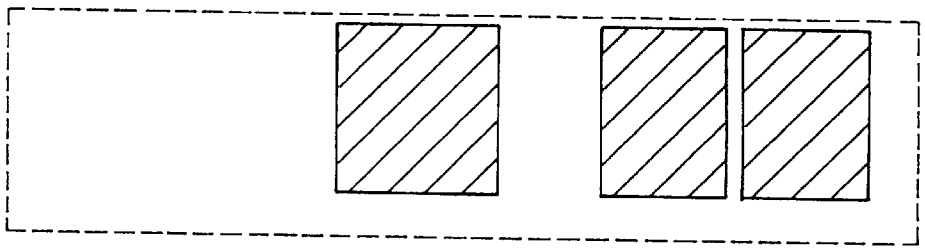
FIG. 11 is a diagram showing a pattern obtained by AND of patterns in FIG. 4 and FIG. 8.
Figure 12:
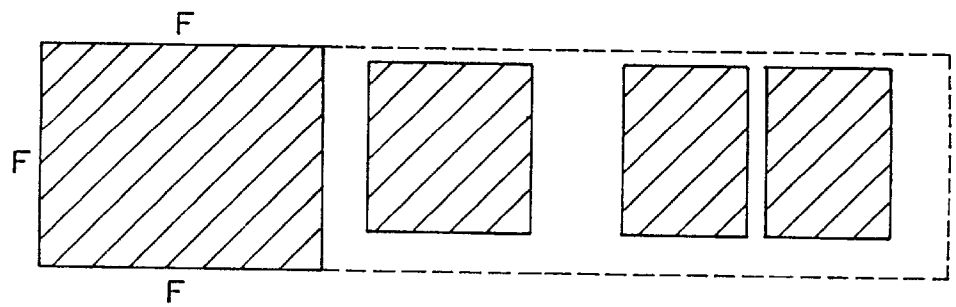
FIG. 12 is a diagram showing a pattern obtained by thinning a pattern obtained by OR of patterns in FIG. 11 and FIG. 5.

First, the mask pattern shown in FIG. 11 is obtained by determining the two-dimensional AND between the mask data expressing the mask pattern of field oxide film (see FIG. 4) and the mask data expressing the mask pattern for threshold voltage control boron implantation of N channel MOS transistor (see FIG. 8). Consequently, between the mask data expressing the mask pattern in FIG. 11 and the mask data expressing the P type well mask pattern shown in FIG. 5, the two-dimensional OR is determined. The thus obtained mask pattern is the mask pattern for forming the first high energy boron implantation P layer 21. When this mask pattern is processed by thinning (for example, 0.5 to 2.5 μm), the pattern as shown in FIG. 12 is obtained. This is the mask pattern for forming the second high energy boron implantation P layer 22.

Thus, in any case, utilizing the mask pattern for manufacturing the semiconductor device for general use, the mask pattern for forming the first and second high energy boron implantation P layers can be easily obtained.

As a first effect, since it requires fewer manufacturing steps, the time of manufacture is shortened, and hence the cost is saved.

The reason is that the high concentration guard boron P layer and guard band P layer conventionally used for fortifying the resistance to radiation are eliminated, while the second high energy boron implantation P layer is introduced to enhance leakage suppressing effect by these layers of the first and second high energy boron implantation P layers.

It is a second effect that the mask patterns for fabricating two high energy boron implantation P layers to be added to the product for general use can be easily obtained from the mask pattern for fabricating the product for general use. As a result, even in the LSI for exclusive use such as CPU, it is easy to design for fortifying the resistance to radiation.

This is because the mask patterns for fabricating first and second high energy boron implantation P layers can be easily obtained from the mask pattern for forming the field oxide film and the mask pattern for forming the P well.

A third effect is that the parasitic capacity between the gate and substrate which took place in the intersecting portion of the guard band P layer and gate electrode can be eliminated.

The reason is that since the guard band P layer is eliminated, it is not necessary to form a thin field oxide film in order for the guard band P layer.

What is claimed is:

1. A radiation-hardened semiconductor device having an N channel MOS transistor, comprising:

a first P type region of a first boron concentration formed by implanting boron by a first high energy in the boundary of P type substrate or P type well forming said N channel MOS transistor and a field oxide film formed at the surface side of said P type substrate or P type well, and a second P type region of a second boron concentration lower than that of said first region formed by implanting boron by a second high energy, lower than said first high energy, near the center in the thickness direction of said field oxide film, wherein said field oxide film, said first P type region and said second P type region are all spaced from an N type diffusion layer composing the source and drain of said N channel MOS transistor, and wherein the size of said first P type region in plan area as seen from the surface side of said semiconductor device is less than the size of said second P type region in plan area, and said second P type region completely covers said first P type region and overlaps edges of said first P type region.

2. A semiconductor device of claim 1, wherein said first P type region and said second P type region are also formed in a P type well contact region for feeding a substrate potential to said N channel MOS transistor.

3. A semiconductor device of claim 1, wherein the edge of said first P type region as seen from the surface of said semiconductor is drawn back from the edge of said second P type region by a specified amount of 0.5 $\mu$m or less.

4. A semiconductor device of claim 1, wherein said N type diffusion layer and said first region and said second region are spaced apart from each other in a range of 0.5 to 1.5 $\mu$m.

5. A semiconductor device of claim 1, wherein said N type diffusion layer and said field oxide film are spaced apart from each other in a range of 0.5 to 2.5 $\mu$m.

* * * * *